United States Patent
Ong

(10) Patent No.: US 7,245,141 B2
(45) Date of Patent: Jul. 17, 2007

(54) SHARED BOND PAD FOR TESTING A MEMORY WITHIN A PACKAGED SEMICONDUCTOR DEVICE

(75) Inventor: Adrian E. Ong, Pleasanton, CA (US)

(73) Assignee: Inapac Technology, Inc., San Jose, CA (US)

( * ) Notice: Subject to any disclaimer, the term of this patent is extended or adjusted under 35 U.S.C. 154(b) by 3 days.

(21) Appl. No.: 11/223,286

(22) Filed: Sep. 9, 2005

(65) Prior Publication Data

US 2006/0152241 A1    Jul. 13, 2006

Related U.S. Application Data

(60) Continuation-in-part of application No. 11/108,385, filed on Apr. 18, 2005, which is a continuation-in-part of application No. 10/679,673, filed on Oct. 3, 2003, now Pat. No. 7,006,940, which is a division of application No. 10/608,613, filed on Jun. 27, 2003, now Pat. No. 6,882,171, application No. 11/223,286, which is a continuation-in-part of application No. 10/305,635, filed on Nov. 27, 2002, now Pat. No. 6,812,726.

(51) Int. Cl.
*G01R 31/26* (2006.01)

(52) U.S. Cl. .................... 324/765; 324/763; 324/158.1; 365/201

(58) Field of Classification Search ..................... None
See application file for complete search history.

(56) References Cited

U.S. PATENT DOCUMENTS

| | | | |
|---|---|---|---|
| 5,594,694 A | 1/1997 | Roohparvar et al. | |
| 5,825,697 A | 10/1998 | Gilliam et al. | |
| 6,191,603 B1 | 2/2001 | Muradali et al. | |
| 6,205,082 B1 * | 3/2001 | Tomita et al. | ............... 365/233 |
| 6,216,240 B1 | 4/2001 | Won et al. | |
| 6,365,421 B2 | 4/2002 | Debenham et al. | |
| 6,366,487 B1 * | 4/2002 | Yeom | ......................... 365/52 |
| 6,457,141 B1 | 9/2002 | Kim et al. | |
| 6,492,727 B2 | 12/2002 | Nishizawa et al. | |
| 6,519,171 B2 | 2/2003 | Matsuzaki et al. | |
| 6,531,339 B2 | 3/2003 | King et al. | |
| 6,711,042 B2 | 3/2004 | Ishikawa | |

(Continued)

OTHER PUBLICATIONS

U.S. Appl. No. 60/798,113, filed May 4, 2006, Ong.

(Continued)

*Primary Examiner*—Minh N. Tang
(74) *Attorney, Agent, or Firm*—Carr & Ferrell LLP

(57) ABSTRACT

A system is provided for communicating with a device within a packaged semiconductor device through a shared external terminal thereof. As one example, the system provides for testing a memory within the package. In addition to the device and the shared external terminal, the system includes a command register that receives a plurality of command signals, and digital logic devices coupled between the external terminal and the command register. Each of the digital logic devices receives a different clock signal and outputs one of the command signals to the command register. The command signals are provided to the external terminal in a sequence that is coordinated with the clock signals so that each digital logic device buffers one of the command signals.

29 Claims, 12 Drawing Sheets

U.S. PATENT DOCUMENTS

| | | | |
|---|---|---|---|
| 6,732,304 B1 * | 5/2004 | Ong | 714/718 |
| 6,812,726 B1 | 11/2004 | Ong | |
| 6,825,683 B1 | 11/2004 | Berndt et al. | |
| 6,882,171 B2 | 4/2005 | Ong | |
| 6,967,397 B2 | 11/2005 | Inoue et al. | |
| 6,996,745 B1 | 2/2006 | Shaylor | |
| 7,006,940 B1 | 2/2006 | Ong | |
| 7,053,470 B1 | 5/2006 | Sellers et al. | |
| 7,061,263 B1 | 6/2006 | Ong | |
| 7,075,175 B2 * | 7/2006 | Kazi et al. | 257/678 |
| 7,133,798 B1 | 11/2006 | Ong | |
| 7,139,945 B2 | 11/2006 | Ong | |
| 7,149,135 B2 | 12/2006 | Okuno | |
| 2004/0100296 A1 | 5/2004 | Ong | |
| 2004/0196709 A1 | 10/2004 | Ong | |
| 2005/0204223 A1 | 9/2005 | Ong | |
| 2005/0289428 A1 | 12/2005 | Ong | |
| 2005/0024977 A1 | 2/2006 | Ong | |
| 2006/0152241 A1 | 7/2006 | Ong | |

OTHER PUBLICATIONS

U.S. Appl. No. 11/552,944, filed Oct. 25, 2006, Ong.
U.S. Appl. No. 11/552,938, filed Oct. 25, 2006, Ong.
U.S. Appl. No. 11/538,799, filed Oct. 4, 2006, Ong.
U.S. Appl. No. 11/480,234, filed Jun. 30, 2006, Ong.
U.S. Appl. No. 11/479,061, filed Jun. 30, 2006, Ong.
U.S. Appl. No. 11/472,016, filed Jun. 20, 2006, Ong.
U.S. Appl. No. 11/443,872, filed May 30, 2006, Ong.
U.S. Appl. No. 11/370,795, filed Mar. 7, 2006, Ong.
U.S. Appl. No. 11/370,769, filed Mar. 7, 2006, Ong.
U.S. Appl. No. 11/369,878, filed Mar. 6, 2006, Ong.
U.S. Appl. No. 11/304,445, filed Dec. 14, 2005, Ong.
U.S. Appl. No. 11/258,484, filed Oct. 24, 2005, Ong.
U.S. Appl. No. 11/208,099, filed Aug. 18, 2005, Ong.
U.S. Appl. No. 11/207,665, filed Aug. 18, 2005, Ong.
U.S. Appl. No. 11/207,518, filed Aug. 19, 2005, Ong.
U.S. Appl. No. 11/108,385, filed Apr. 18, 2005, Ong.
U.S. Appl. No. 11/083,473, filed Mar. 18, 2005, Ong.
U.S. Appl. No. 10/877,687, filed Jun. 25, 2004, Ong.
U.S. Appl. No. 10/205,883, filed Jul. 25, 2002, Ong.
U.S. Appl. No. 09/681,053, filed Dec. 12, 2000, Kolluru.
U.S. Appl. No. 11/744,815, filed May 4, 2007, Ong.

* cited by examiner

SHARED BOND PAD FOR TESTING A MEMORY WITHIN A PACKAGED SEMICONDUCTOR DEVICE

CROSS-REFERENCE TO RELATED APPLICATIONS

This application is a continuation-in-part of and claims the benefit of and priority to, co-pending U.S. patent application Ser. No. 11/108,385, filed on Apr. 18, 2005, entitled "Bonding pads for testing of a semiconductor device," which is a divisional of U.S. Pat. No. 6,882,171 filed on Jun. 27, 2003 and entitled "Bonding pads for testing of a semiconductor device," which is a continuation-in-part of U.S. Pat. No. 6,812,726, filed on Nov. 27, 2002, entitled "Entering test mode and accessing of a packaged semiconductor device," this application is also a continuation-in-part of, and claims the benefit of and priority to, co-pending U.S. Pat. No. 7,006,940, filed on Oct. 3, 2003, entitled "Set up for a first integrated circuit chip to allow for testing of a co-packaged second integrated circuit chip."

This application is related to U.S. patent application Ser. No. 11/207,665, filed on Aug. 18, 2005, entitled "Electronic device having an interface supported testing mode." The disclosures of all of the above U.S. patents and patent applications are incorporated by reference herein.

TECHNICAL FIELD OF THE INVENTION

The invention relates generally to the field of semiconductor integrated circuits, and more particularly, to testing semiconductor integrated circuits within a packaged semiconductor device.

BACKGROUND

A semiconductor or integrated circuit (IC) device may comprise many miniaturized circuits implemented on a semiconductor substrate. IC devices are commonly tested in order to ensure proper operation before being used. IC devices can be tested in a limited fashion using built-in self test (BIST) circuitry. However, BIST testing is incomplete and does not test all aspects of operation. Thorough testing of an IC device is therefore accomplished using complex external testing equipment. In order for complex test equipment to be used, many dedicated external input/output (I/O) terminals are typically required to allow the test equipment to input various test patterns, codes, and data, and to stress the circuitry of the IC device. However, in an environment where multiple IC devices are combined within a single semiconductor device package having a limited number of input/output terminals it can be difficult, if not impossible, to use external testing equipment for testing one or more of the multiple IC devices thoroughly. Often, the addition of dedicated external terminals is impractical.

SUMMARY

According to one embodiment of the present invention, a system is provided for testing a first integrated circuit chip packaged along with at least a second integrated circuit chip in a semiconductor device, wherein at least some external terminals for the semiconductor device are to be shared by the first and second integrated circuit chips, and wherein the semiconductor device is designed for a normal operation mode and a test mode. The system includes one or more test buffer multiplexer circuits. Each test buffer multiplexer circuit is operable to either convey a respective signal from a shared bond pad to the second integrated circuit chip or convey a respective signal from the second integrated circuit chip to the first integrated circuit chip, when the semiconductor device is in the normal operation mode. Each test buffer multiplexer circuit is further operable to convey a respective signal from the same shared bond pad to the first integrated circuit when the first integrated circuit chip is in a test mode. An external terminal of the semiconductor device is optionally operable to receive a signal for causing the semiconductor device to transition between the normal operation mode and the test mode.

In various embodiments, each test buffer multiplexer circuit may include a signal multiplexer, a plurality of buffers, and/or a combination thereof.

According to another embodiment of the present invention, a memory chip is packaged with at least a system chip in a semiconductor device, wherein at least some of the external data terminals of the semiconductor device are shared by the memory chip and the system chip, and wherein the memory chip is designed for both a normal operation mode and a test mode. The memory chip includes one or more test buffer multiplexer circuits. Each test buffer multiplexer circuit is operable to receive a respective signal from the system chip on behalf of the memory chip, when the memory chip is in a normal operation mode, and is further operable to receive a respective signal from an associated external terminal on behalf of the memory chip, when the memory chip is in a test mode. The associated external terminal is optionally configured for conveying signals to the system chip in the normal operation mode. A test input control buffer circuit is operable to receive a signal for transitioning the memory chip between the normal operation and test modes.

According to yet another embodiment of the present invention, a method is provided for testing a first integrated circuit chip packaged along with at least a second integrated circuit chip in a semiconductor device, wherein at least some external terminals for the semiconductor device are shared by the first and second integrated circuit chips, and wherein the first integrated circuit chip is designed for operation in both normal operation and test modes. The method includes: transitioning the first integrated circuit chip from the normal operation mode into the test mode, programming test codes in the first integrated circuit chip; and operating the first integrated circuit chip according to the programming codes and using test addresses and test patterns. The programming of test codes is optionally performed in a serial manner through an external terminal, while the same external terminal is used to receive parallel data in the normal operation mode.

According to yet another embodiment of the present invention, a system is provided for testing a first integrated circuit chip packaged along with at least a second integrated circuit chip in a semiconductor device, the first integrated circuit chip comprising a logic device, wherein at least some external terminals for the semiconductor device are shared by the first and second integrated circuit chips, wherein the first integrated circuit chip is designed for operation in both normal operation and test modes, the system comprising one or more test buffer multiplexer circuits, each test buffer multiplexer circuit operable to receive a respective signal from the second integrated circuit chip when the first integrated circuit chip is in the normal operation mode, each test buffer multiplexer circuit operable to receive a respective signal from either the second integrated circuit chip or an associated external terminal when the first integrated circuit chip is in the test mode, and an external terminal of the semiconductor device that is operable to receive a signal for causing the first integrated circuit chip to transition between the normal operation and the test modes.

According to still another embodiment of the present invention, a semiconductor device package comprises a semiconductor device, a command register configured to receive a plurality of command signals for affecting the semiconductor device, an external terminal, and a plurality of digital logic devices coupled between the external terminal and the command register, each digital logic device configured to receive a different clock signal and to output one of the plurality of command signals. The semiconductor device can be, for example, a memory such as a SDRAM, and the command signals can be for testing the memory. The external terminal can be a lead, pin, or bonding pad, for instance. In some embodiments the digital logic devices include D flip-flops. In some further embodiments, the semiconductor device package further comprises circuitry configured to output the different clock signals received by the digital logic devices.

According to still another embodiment of the present invention, a semiconductor device package comprises a semiconductor device, means for generating, according to a plurality of command signals, a function signal for affecting the semiconductor device, an external terminal, and means for serially receiving the plurality of command signals from the external terminal and for providing the plurality of command signals to the means for generating the function signal. Some embodiments further comprise means for providing sequenced clock signals to the means for serially receiving the plurality of command signals.

Still another embodiment of the present invention provides a method of affecting a semiconductor device of a semiconductor device package. The method comprises serially providing a plurality of command signals to an external terminal of the semiconductor device package, and generating, according to the plurality of command signals, a function signal for affecting the semiconductor device. In some embodiments, the method further comprises receiving the plurality of command signals each in a separate buffer. The separate buffers can include, for example, a plurality of digital logic devices such as D flip-flops. In some embodiments, receiving the plurality of command signals can include sequentially enabling each of the separate buffers. In some of these embodiments the method further comprises generating a plurality of sequenced clock signals. In those embodiments in which the semiconductor device comprises a memory, the function signal for affecting the memory can include, for instance, a testing signal, a TDQ signal, or a bank address.

Important technical advantages of the present invention will be readily apparent to those skilled in the art from the following figures, descriptions, and claims.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION

The embodiments of the present invention and their advantages are best understood by referring to FIGS. 1 through 15 of the drawings. Like numerals are used for like and corresponding parts of the various drawings.

Semiconductor Devices

Figure 1A:
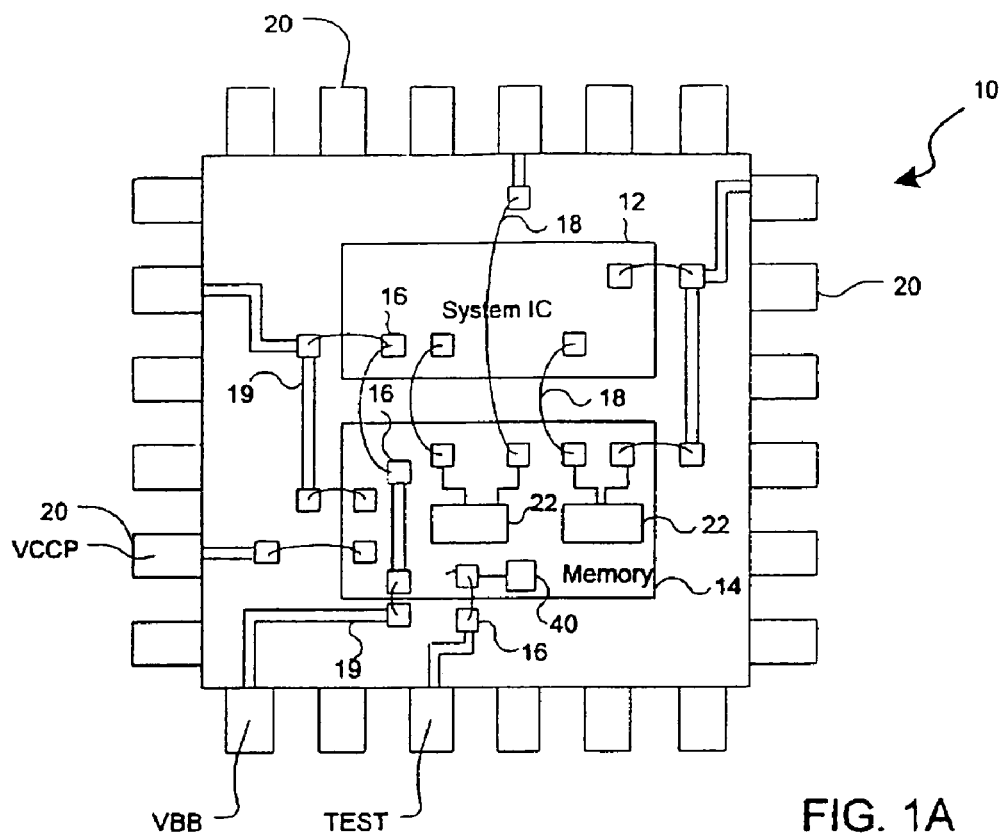
FIG. 1A is a block diagram of an exemplary semiconductor device, according to an embodiment of the present invention.
Figure 1B:
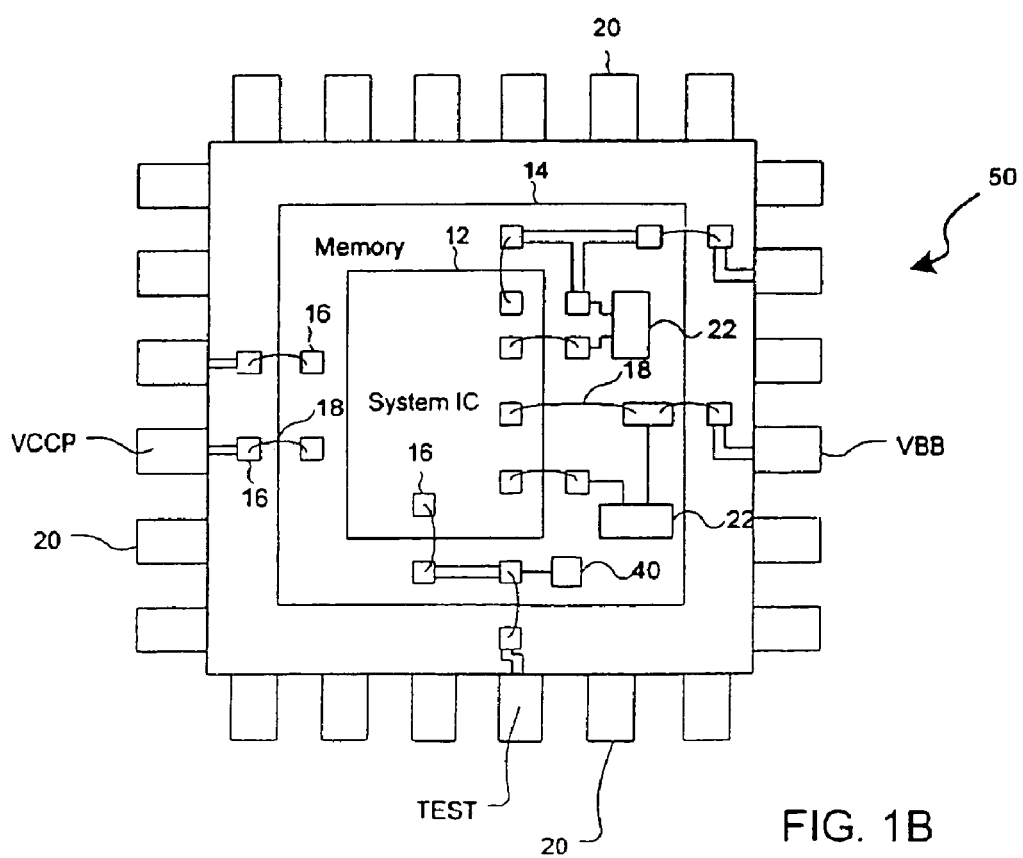
FIG. 1B is a block diagram of another exemplary semiconductor device, according to an embodiment of the present invention.

FIGS. 1A and 1B illustrate exemplary semiconductor devices 10 and 50 in which systems and methods, according to various embodiments of the invention, can be incorporated and used. Semiconductor devices 10 and 50 represent a variety of integrated circuit (IC) devices (also referred to herein as packaged devices or semiconductor device packages) that may require testing, such as, for example, by external automated test equipment or an integrated circuit tester. Each of semiconductor devices 10 and 50 can be packaged as a standard ball grid array (BGA) or thin quad flatpack (TQFP) having 144 pins or more. However, other types of packaging may be used. For example, the packaging can have a ceramic base with wire bonding or employing thin film substrates, and mounting on a silicon substrate or a printed circuit board (PCB) substrate. The packaging may further utilize various surface mount technologies such as a single in-line package (SIP), dual in-line package (DIP), zig-zag in-line package (ZIP), plastic leaded chip carrier (PLCC), small outline package (SOP), thin SOP (TSOP), flatpack, and quad flatpack (QFP), or the like, and utilizing various leads or external connectors (e.g., J-lead, gull-wing lead) or BGA type connectors, or the like. These and other types of packaging referred to herein are referred to as semiconductor device packages.

FIG. 1A is a block diagram of an exemplary semiconductor device 10, according to an embodiment of the present invention. As depicted, semiconductor device 10 comprises a system integrated circuit (IC) 12 and a memory 14. Each of system IC 12 and memory 14 can be implemented in a separate semiconductor die (commonly referred to as a "chip"). Each die is a monolithic structure formed from, for example, silicon or another suitable material. Accordingly, semiconductor device 10 can be referred to as a "multi-chip module" (MCM).

System IC 12 can be a chip with logic circuitry, such as, for example, an application specific integrated circuit (ASIC), a processor, a microprocessor, a microcontroller, a field programmable gate array (FPGA), programmable logic device (PLD), complex programmable logic device (CPLD), or another logic device. Memory 14 can be an IC memory chip, such as, for example, static random access memory (SRAM), dynamic random access memory (DRAM), synchronous DRAM (SDRAM), non-volatile random access memory (NVRAM), and read only memory (ROM), such as erasable programmable ROM (EPROM), electrically erasable programmable ROM (EEPROM), and flash memory. As noted in U.S. application Ser. No. 09/967,389 entitled "Testing of integrated circuit devices," filed on Sep. 28, 2001, (assigned to the same assignee and incorporated by reference herein in its entirety), other types of devices in addition to or instead of memory 14 may be tested. Thus, the teachings herein relating to memory 14 may be alternatively applied to logic chips, such as gate arrays or programmable logic devices, processor or specialized chips, such as an application specific integrated circuit (ASIC), a microprocessor, a microcontroller, a digital signal processor (DSP), or the like.

Memory 14 is provided to work in conjunction with system IC 12. Specifically, memory 14 provides storage capabilities for data/information that is provided from system IC 12 or other components. System IC 12 provides processing capability for operating on data/information, and may retrieve information from and store information into memory 14. When the semiconductor device 10 is in a normal operation mode, signals for data/information may be received by memory 14 from system IC 12.

System IC 12 and memory 14 may each comprise one or more bonding pads 16, which can be connected via, for example, bonding wires 18, to provide communication between the chips and/or other components within or external to the semiconductor device 10. As used herein, the terms "connected," "coupled," or any variant thereof, means any connection or coupling, either direct or indirect, between two or more elements. For clarity, in FIG. 1A, only a portion of the bonding pads 16 and bonding wires 18 are provided with reference numerals. At least some of the bonding pads 16 and bonding wires 18 provide communication directly between system IC 12 and memory 14.

In one embodiment, system IC 12 and memory 14 are mounted in a side-by-side arrangement on a printed circuit board (PCB) substrate, such as for a multi-chip package (MCP). The PCB substrate may also include bonding pads 16 and traces 19. In one embodiment, at least some traces 19 formed on either memory 14 or system IC 12 are used for pin-out for the other chip.

As shown, semiconductor device 10 includes a number of external terminals 20 which can be, for example, input/output (I/O) leads, pins, or bonding pads. For clarity, in FIG. 1A, only some of the external terminals 20 are provided with reference numerals. In general, external terminals 20 enable the components within the semiconductor device 10 to exchange data/information with components external to the device 10. In one embodiment, one or more of these external terminals 20 are connected to and serve both the system IC 12 and memory 14. That is, an external terminal 20 which provides I/O capability for the system IC 12 may also provide I/O capability for the memory 14.

To verify that semiconductor device 10 is operating properly, the components contained therein should be thoroughly tested. For this purpose, in one embodiment, memory 14 may receive signals from test equipment that is external to the device 10. One or more test buffer multiplexer circuits 22 are provided or incorporated in memory 14. Each multiplexer circuit 22 generally functions to multiplex between signals that are generated in the normal operation of the semiconductor device 10 and signals that are generated for testing of the semiconductor device 10. The signals generated in normal operation may originate, for example, from system IC 12, whereas testing signals may originate from external test equipment.

Memory 14 may also comprise an on-chip sequence pattern generator, such as that described in related U.S. application Ser. No. 10/205,883 entitled "Internally generating patterns for testing in an integrated circuit device," filed on Jul. 25, 2002, assigned to the same assignee and incorporated by reference herein in its entirety. The pattern generator can comprise a test column address counter and a test row address counter. The test column address counter is configured to increment independently of the test row address counter. The address counters function to internally generate sequences of numbers for use as addresses during testing.

If memory 14 were packaged as a discrete component (i.e., separate from system IC 12), thorough testing of the memory would require full access to all data, control, and access points of memory 14 so that complete test patterns could be input and extracted from the memory 14. However, since memory 14 is packaged with system IC 12 in semiconductor device 10, and various access points of memory 14 are connected to system IC 12 for normal operation, test buffer multiplexer circuits 22 enable full access to memory 14 by multiplexing between signals from system IC 12 in normal operation and signals from external test equipment during testing. In this way, the external terminals 20 which are shared between the memory 14 and system IC 12 can emulate test pins which would be dedicated if the memory 14 were packaged separately.

In one embodiment, the signals which can be multiplexed include clock enable (CKE), chip select (CS), row address strobe (RAS), column address strobe (CAS), write enable (WE), data read/write mask (DQM), bank select (BA), all row precharge (AP), bi-directional test data I/O (TD), set (SET), and load (LOAD), and respective testing counterparts for the same. It should be understood, that in other embodiments, signals in addition to or other than one or more of those described immediately above may be multiplexed.

In addition, one or more external terminals 20 may be dedicated (i.e., not shared between system IC 12 and memory 14) for testing memory 14. In one embodiment, dedicated terminals 20 can receive signals for test (TEST), analog word-line voltage (VCCP), and analog memory substrate voltage (VBB). The TEST signal generally functions to put the memory 14 into the test mode. The VCCP and VBB signals are used for stressing the memory 14 by providing voltage levels significantly above or below VDD and VSS. In another embodiment, only one external terminal 20—i.e., the one for the TEST signal—is dedicated for testing memory 14, and the signals for VCCP and VBB are generated internally within memory 14. This configuration reduces the total number of external terminals 20 for the semiconductor device 10. In yet another embodiment, the external terminal 20 which receives the TEST signal is shared between the memory 14 and system IC 12. In this embodiment, a voltage level which differs from the voltage levels used in normal operation is applied to the external terminal 20 to put the memory 14 into the test mode, as discussed herein in more detail.

Semiconductor device 10 can work in either the normal operation mode or in the test mode. In normal operation, system IC 12 and memory 14 cooperate to receive, process, store, and output data and information. In the test mode, one or both of the system IC 12 and the memory 14 may be functionally tested to verify proper operation. With some embodiments of the present invention, memory 14 can be tested completely separately from system IC 12.

In one embodiment, semiconductor device 10 (and in particular, the memory 14) can be placed in the testing mode by the use of various control signals, such as, for example, the TEST, SET and LOAD signals. Memory 14 may include a test input control buffer circuit 40, which generally functions to receive and buffer control signals for programming the memory 14. In some embodiments, the TEST signal is made a high value (or "1", such as VDD) and remains high throughout in-package testing. The SET and LOAD signals are initially at a low value (or "0", such as GND). Then the SET and LOAD signals are pulsed high for predetermined periods (e.g., 10 ns) to enable test buffer multiplexer circuits 22 on memory 14. The device 10 is now in the test mode. To exit the test mode, in one embodiment, the TEST signal is brought to a low value ("0"), which clears all test operations and disables the test input buffers.

The test mode can include two phases, a programming phase and an access phase. In the programming phase, the memory 14 can be set up or programmed for testing. This set up can include, for example, loading test addresses and sequential test data patterns (or codes) into various parts of the memory 14 (e.g., row and column test counters). In one embodiment, one or more test data (TDQ) signals are used to program test modes, load test addresses, load test vectors, and load test patterns. The SET and LOAD signals can be used to enable test addresses or vectors to be set and loaded. An exemplary timing diagram illustrating the pulses for SET and LOAD signals to program a code into memory 14 is shown and described with reference to FIG. 8, below. All test mode programming can be performed asynchronously (i.e., no clock is required). In one embodiment, a test control signal (TCNT) is set to a high value ("1") to cause the memory 14 to exit the programming phase and enter the access phase. In the access phase new test addresses and vectors can no longer be programmed.

In the access phase, the memory 14 is operated using the test addresses and test patterns. In one embodiment, while in the access phase, the memory 14 only recognizes the addresses from the programmed row and column test counters, and all external and burst counter addresses are ignored by the memory 14. The TDQ signals are then used to read and write data to memory 14. A test stop row (TSR) counter signal may be used to stop the row address counter, and a test stop column (TSC) counter signal may be used to stop the column address counter while in the access phase. This allows independent incrementation (or decrementation) of row and column addresses. Both the TSR and TSC counter signals may be independent of the CLK signal. In general, with some embodiments, programming of the memory 14 during testing can be asynchronous. In other embodiments, programming can be synchronous for the memory 14. Additionally, during the access phase, the memory 14 may operate either synchronously or asynchronously, depending on the memory specification.

With the systems and methods, according to various embodiments of the invention, an IC chip (e.g., memory 14) which is packaged along with one or more other chips (e.g., system IC 12) can be fully tested without requiring a significant number of dedicated I/O terminals. Control signals from complex external test equipment (e.g., a standard external memory tester) can be provided to all data, control, and access pads of the desired IC chip for thorough and complete testing using a variety of test patterns and sequences accordingly, these embodiments provide complete and flexible testing of IC devices.

In some embodiments, the systems and methods described herein can also be used in conjunction with the systems and methods described in related U.S. application Ser. No. 09/666,208 entitled "Chip testing within a multi-chip semiconductor package," filed on Sep. 21, 2000, assigned to the same assignee and incorporated herein by reference in its entirety.

FIG. 1B is a block diagram of another exemplary semiconductor device 50, according to another embodiment of the present invention. Semiconductor device 50 is similar in many respects to semiconductor device 10 depicted in FIG. 1A. That is, semiconductor device 50 comprises a system IC 12 and a memory 14 (each with bonding pads 16 provided thereon), and external terminals 20 for communicating data/information into and out of semiconductor device 50. Memory 14 receives signals from system IC 12. Furthermore, memory 14 comprises one or more test buffer multiplexer circuits 22 for enabling multiplexing between the signals generated in normal operation and the signals generated for testing, thereby allowing the memory 14 to be thoroughly tested with external test equipment.

In semiconductor device 50, system IC 12 and a memory 14 are provided in a stacked arrangement. In this arrangement, the system IC 12 can be attached to the memory 14 using, for example, any suitable adhesive. Traces 19 can be formed on memory 14 for pin-out for system IC 12. Furthermore, although not depicted, some traces 19 can also be formed on the system IC 12 for pin-out for the memory 14.

In one embodiment, one or both of the test analog voltages (i.e., word-line voltage (VCCP) and analog memory substrate voltage (VBB)) are multiplexed with voltages used in the normal operation mode. For this, respective test buffer multiplexer circuits 22 may be provided or incorporated in memory 14.

Test Buffer Multiplexer Circuit

Figure 2A:
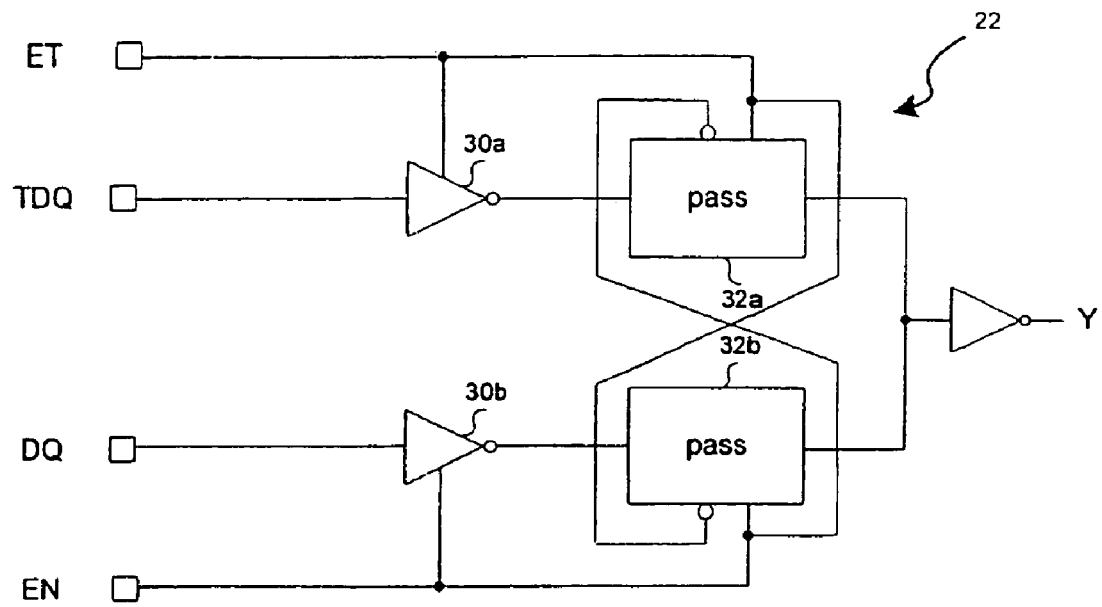
FIG. 2A is schematic diagram of an exemplary implementation of a test buffer multiplexer circuit, according to an embodiment of the present invention.

FIG. 2A is schematic diagram of an exemplary implementation of a test buffer multiplexer circuit 22, according to an embodiment of the present invention. Test buffer multiplexer circuit 22 can be implemented or incorporated in a memory 14 to support the testing thereof. In the depicted embodiment, the test buffer multiplexer circuit 22 comprises buffer circuits 30a, 30b and pass gate circuits 32a, 32b.

Figure 3:
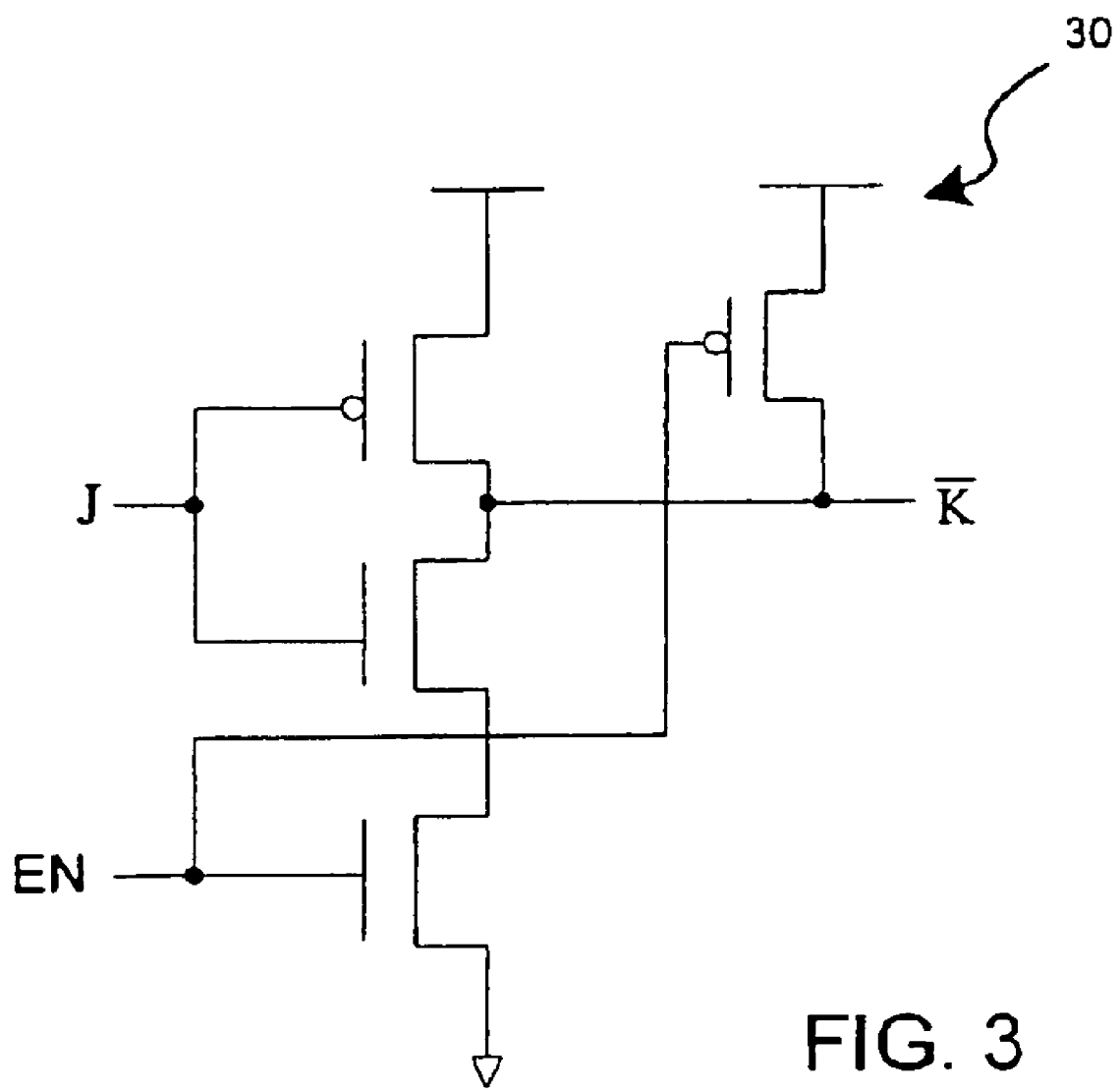
FIG. 3 is a schematic diagram of an exemplary implementation of an input buffer circuit.

One buffer circuit 30b is connected to receive a signal (e.g., data (DQ)) from system IC 12, while the other buffer circuit 30a is connected to receive a corresponding test signal (e.g., test data (TDQ)) from a testing machine via an external terminal 20. Buffer circuit 30a is enabled by an enable test (ET) signal, while buffer circuit 30b is enabled with an enable normal (EN) signal. The ET and the EN signals can be complementary signals, and may both be supported by the same external terminal which, for example, receives the TEST signal. This external terminal can be either dedicated for receiving the TEST signal to place the memory 14 in the test mode, or alternatively, shared between the memory 14 and the system IC 12. An exemplary implementation of a buffer circuit 30 is depicted in FIG. 3.

Pass gate circuit 32a is coupled at its input to receive the output of buffer circuit 30a. Pass gate circuit 32b is likewise coupled at its input to receive the output of buffer circuit 30b. Both pass gate circuits 32a, 32b receive the enable test and enable normal signals. Each pass gate circuit 32a, 32b generally functions to pass the value of a signal appearing at its input as the value of its output signal upon a particular combination of values for the enable test and enable normal signals. For example, in one embodiment, when the enable test signal has a high value (or "1") and the enable normal has a low value (or "0"), then the value of the output signal from buffer circuit 30a appears at output Y for the test buffer multiplexer circuit 22. An exemplary implementation of a pass gate circuit is described in related U.S. application Ser. No. 09/967,389 entitled "Testing of integrated circuit devices," filed on Sep. 28, 2001, assigned to the same assignee and incorporated herein by reference in its entirety.

Although only a single test buffer circuit 22 is depicted in FIG. 2A for the data signal and its counterpart test signal, it should be understood that a plurality of test buffer circuits 22 can be provided on a memory 14 for multiplexing various other signals from the system IC 12 (e.g., CLK, CKE, CS, RAS, CAS, WE, DQM, BA, and AP) and their counterpart test signals (e.g., TCLK, TCKE, TCS, TRAS, TCAS, TWE, TDQM, TBA, and TAP).

In operation, when the memory 14 on which the test buffer multiplexer circuit 22 is implemented is in the normal operation mode, the value of the signal (e.g., DQ) from the system IC 12 is buffered and passed as the output Y of the multiplexer circuit 22. Alternatively, when the memory 14 is placed in the test mode, the value of the signal (e.g., TDQ) from an external testing equipment is buffered and passed as the output Y of the multiplexer circuit 22.

Figure 2B:
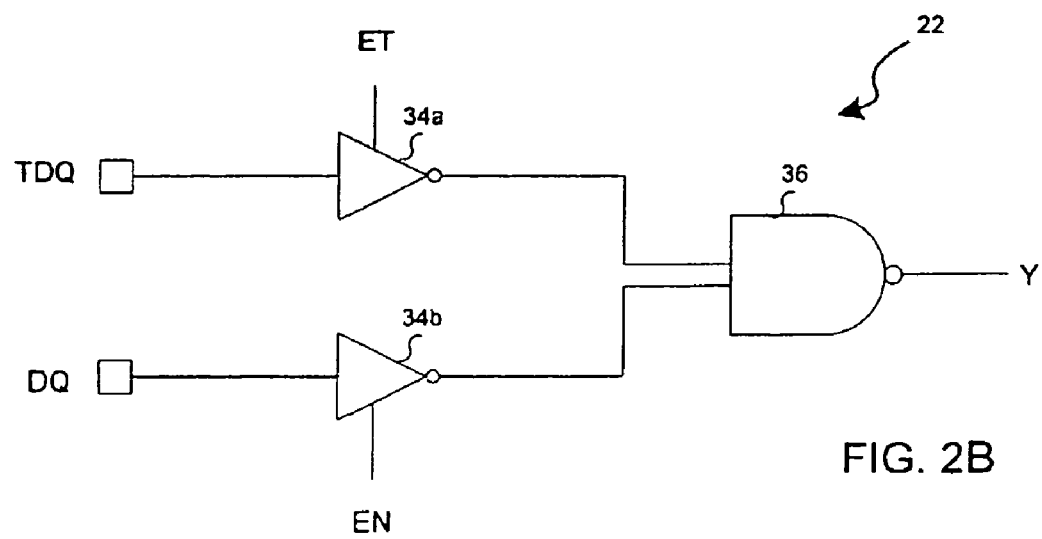
FIG. 2B is schematic diagram of another exemplary implementation of a test buffer multiplexer circuit, according to an embodiment of the present invention.

FIG. 2B is a schematic diagram of another exemplary implementation of a test buffer multiplexer circuit 22, according to another embodiment of the present invention. In this embodiment, as depicted, test buffer multiplexer circuit 22 comprises buffer circuits 34a, 34b and a NAND gate 36.

Buffer circuit 34b is connected to receive a signal (e.g., data (DQ)) from system IC 12, and buffer circuit 34a is connected to receive a corresponding test signal (e.g., test data (TDQ)) from a testing machine via an external terminal 20. Buffer circuits 34a and 34b are enabled by the enable test (ET) and enable normal (EN) signals, respectively. NAND gate 36 receives and performs a "NAND" operation on the outputs of buffer circuits 34a and 34b. NAND gate 36 outputs a value of the Y signal, which is the output for the multiplexer circuit 22.

As with FIG. 2A, although only a single test buffer circuit 22 is depicted in FIG. 2B for the data signal and its counterpart test signal, it should be understood that a plurality of test buffer circuits 22 may be provided on the memory 14 for multiplexing various other signals from the system IC 12 and their counterpart test signals.

Figure 2C:
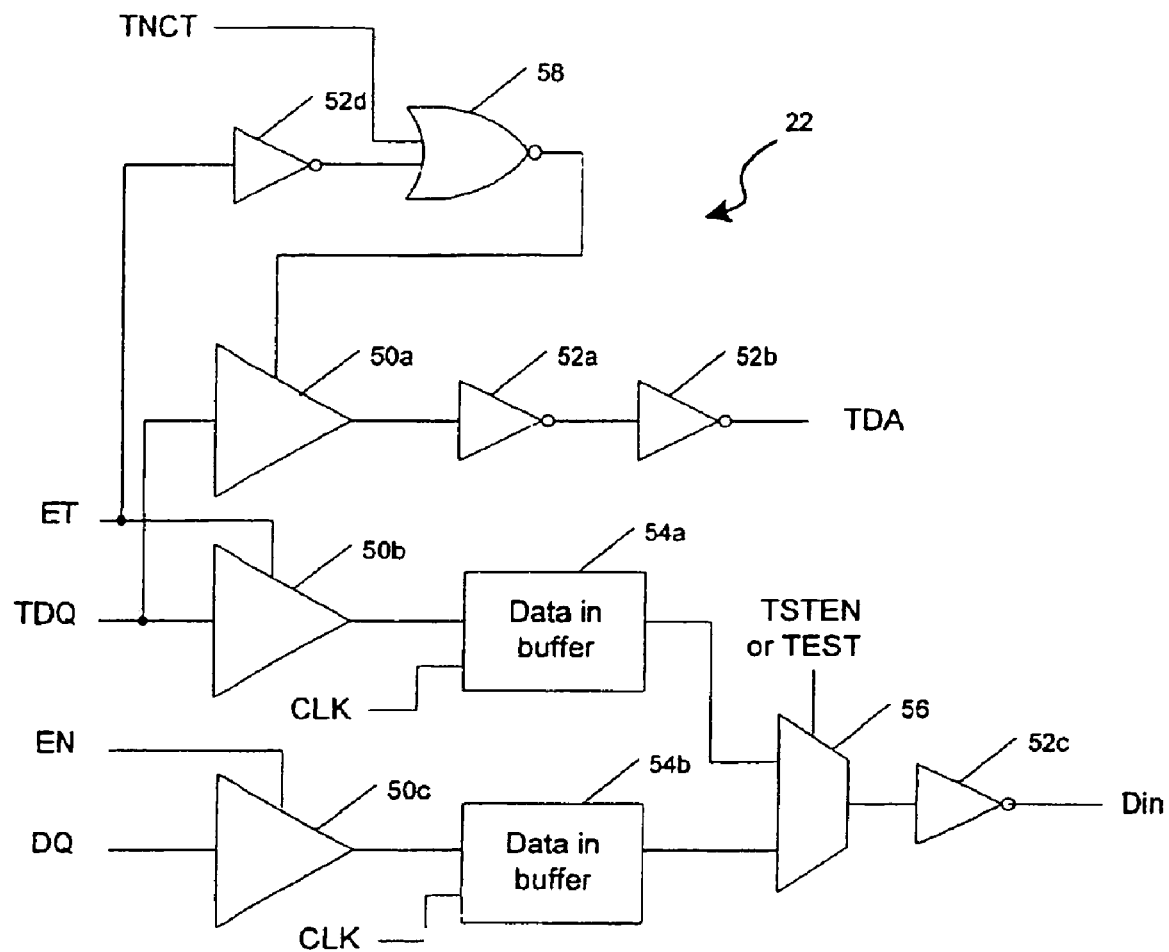
FIG. 2C is schematic diagram of yet another exemplary implementation of a test buffer multiplexer circuit, according to an embodiment of the present invention.

FIG. 2C is a schematic diagram of yet another exemplary implementation of a test buffer multiplexer circuit 22, according to yet another embodiment of the present invention. In this embodiment, as depicted, test buffer multiplexer circuit 22 comprises buffer circuits 50a, 50b, 50c, inverter gates 52a, 52b, 52c, 52d, data buffers 54a, 54b, a multiplexer (MUX) 56, and a NOR gate 58.

Buffer circuit 50a and inverter gates 52a, 52b are part of a path for inputting program code data into memory 14, for example, during a programming phase of the test mode for the memory 14. Buffer circuit 50a receives a test signal (e.g., test data (TDQ)) from an external test machine. Buffer circuit 50a can be enabled by a signal that is derived from logic operations performed on the enable test (ET) signal and a test control or test counter (TCNT) signal. The output of buffer circuit 50a and inverter gates 52a, 52b is a TDA signal for programming memory 14. In one embodiment, eight TDA signals (i.e., TDA[0:7]) may be supported for programming up to 256 test codes. Eight TDQ signals (i.e., TDQ[0:7]) may be supported as well.

In one embodiment, the TCNT signal defaults to a low value upon entry into the test mode. The low value is maintained while the memory 14 is in the programming phase of the test mode, and switches to a high value when the memory 14 is in the access phase of the test mode. TCNT signal can be set to the high value using the SET and LOAD (code) signals. For example, in one embodiment, the TCNT signal can be set to VDD by bringing the SET signal to a high value with the values of TDQ[7:0]=00110000. The LOAD signal is used for loading registers, such as test address or test pattern.

Buffer circuit 50b and data buffer 54a are part of a path for inputting test data into memory 14, for example, during the access phase of the test mode. Buffer circuit 50b is enabled by the enable test (ET) signal and may receive the test data (TDQ)) from an external test machine. Data buffer 54a is connected to receive the output signal of buffer circuit 50b and a clock (CLK) signal. Data buffer 54a latches the output of circuit 50b and may output the same on an edge of the CLK signal.

Buffer circuit 50c and data buffer 54b are part of a path for inputting data into memory 14, for example, during normal operation of the memory 14. Buffer circuit 50c is enabled by the enable normal (EN) signal and receives the data (DQ) from system IC 12. Data buffer 54b is connected to receive the output signal of buffer circuit 50c and a clock (CLK) signal. Data buffer 54b latches the output of circuit 50c and may output the same on an edge of the CLK signal.

Multiplexer 56 is connected to receive the output signals of data buffers 54a and 54b, and can be enabled with a TEST signal, a TSTEN signal, or a TCNT signal. Depending on the values of the EN and ET signals, multiplexer 56 will pass (via inverter gate 52c) either the output of data buffer 54a or the output of data buffer 54b to other circuitry on memory 14. In particular, if memory 14 is in the test mode (access phase), the output of data buffer 54a is provided to the memory 14 for testing of the same. If memory 14 is in the normal operating mode, the output of data buffer 54b is provided to the memory 14. In other embodiments, the multiplexer 56 can be replaced by other circuitry, such as a NAND gate.

Test Input Control Buffer Circuits

Figure 4:
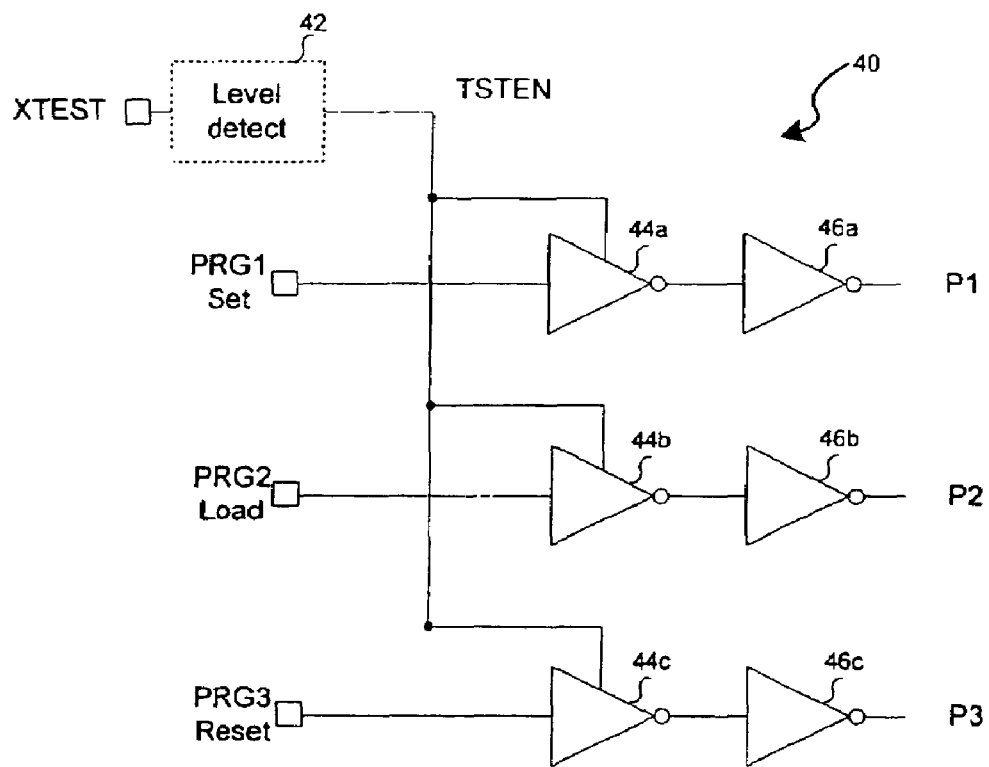
FIG. 4 is a schematic diagram of an exemplary implementation of a test input control buffer circuit, according to an embodiment of the invention.

FIG. 4 is a schematic diagram of an exemplary implementation of a test input control buffer circuit 40, according to an embodiment of the invention. Test input control buffer circuit 40 can be implemented or incorporated in a memory 14 to support the testing thereof. Test input control buffer circuit 40 generally functions to receive and buffer control signals for programming the memory 14 during the programming phase of the test mode. As depicted, test control buffer circuit 40 comprises a level detect circuit 42, input buffer circuits 44a, 44b, 44c, and inverter gates 46a, 46b, 46c.

Figure 5:
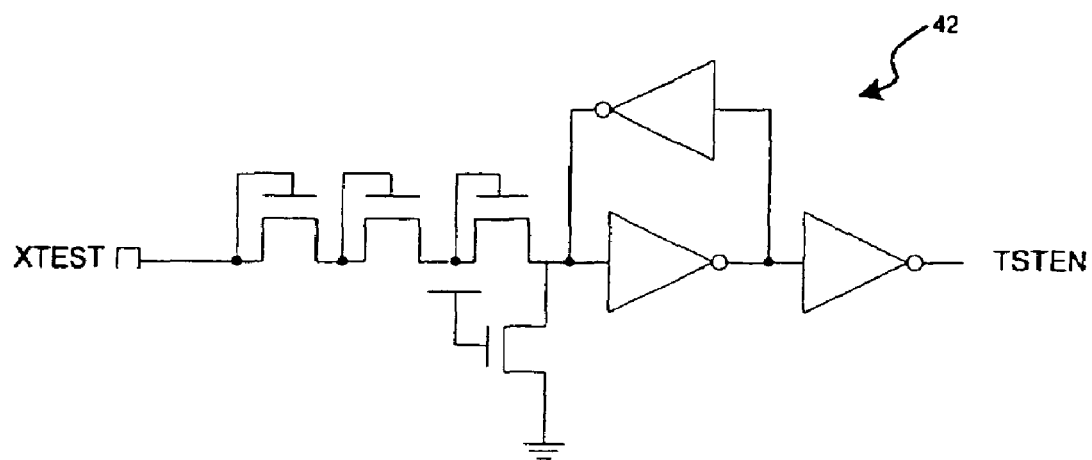
FIG. 5 is a schematic diagram of an exemplary implementation of a level detect circuit, according to an embodiment of the invention.

Level detect circuit 42 is optional and can be provided as part of the test input control buffer circuit 40 when the external terminal for receiving the TEST signal is shared between the memory 14 and a system IC 12. In such embodiments, to avoid inadvertently placing the memory 14 into the test mode during normal operation, a voltage level which differs from the voltage levels used in normal operation is used for putting the memory 14 into test mode. This voltage level can be, for example, a negative voltage (e.g., −3V) or a higher than normal voltage (e.g., 7V if VDD for memory 14 is 3.3V). Level detect circuit 42 receives the external TEST signal (XTEST) and generates an internal test enable (TSTEN) signal that is provided to enable each of the input buffer circuits 44a, 44b, 44c. An exemplary implementation of level detect circuit 42 is depicted in FIG. 5.

Referring again to FIG. 4, if the external terminal for receiving the TEST signal is dedicated, level detect circuit 42 is not needed and thus would not be present in test input control buffer circuit 40. In this case, the external TEST signal can be applied directly to input buffer circuits 44a, 44b, 44c. In one embodiment, for this situation, a high value for the TEST signal puts the memory 14 into the test mode, while a low value for the TEST signal takes the memory 14 out of the test mode.

A dedicated pairing of an input buffer circuit and an inverter gate is provided for each of a number of programming control (PRG) signals, such as, for example, the SET, LOAD, and RESET signals. For each pair, when the input buffer circuit is enabled, the respective control signal is buffered in the input buffer circuit then output to the respective inverter gate where the signal is inverted. The output of each inverter gate is a respective program P signal (separately labeled P1, P2, P3). The program P signals are provided to control the test programming of the memory 14 when the memory 14 is in the programming phase of the test mode. For example, program P signals can be used to set flags and other conditions in the memory 14.

It should be noted that in alternative implementations for a test input control buffer circuit 40, any number of input buffer circuits and inverter gates, or any other suitable circuitry, can be used to support control signals that are in addition to, or instead of, the specific signals depicted in FIG. 4.

Enable Test and Enable Normal

Figure 6:
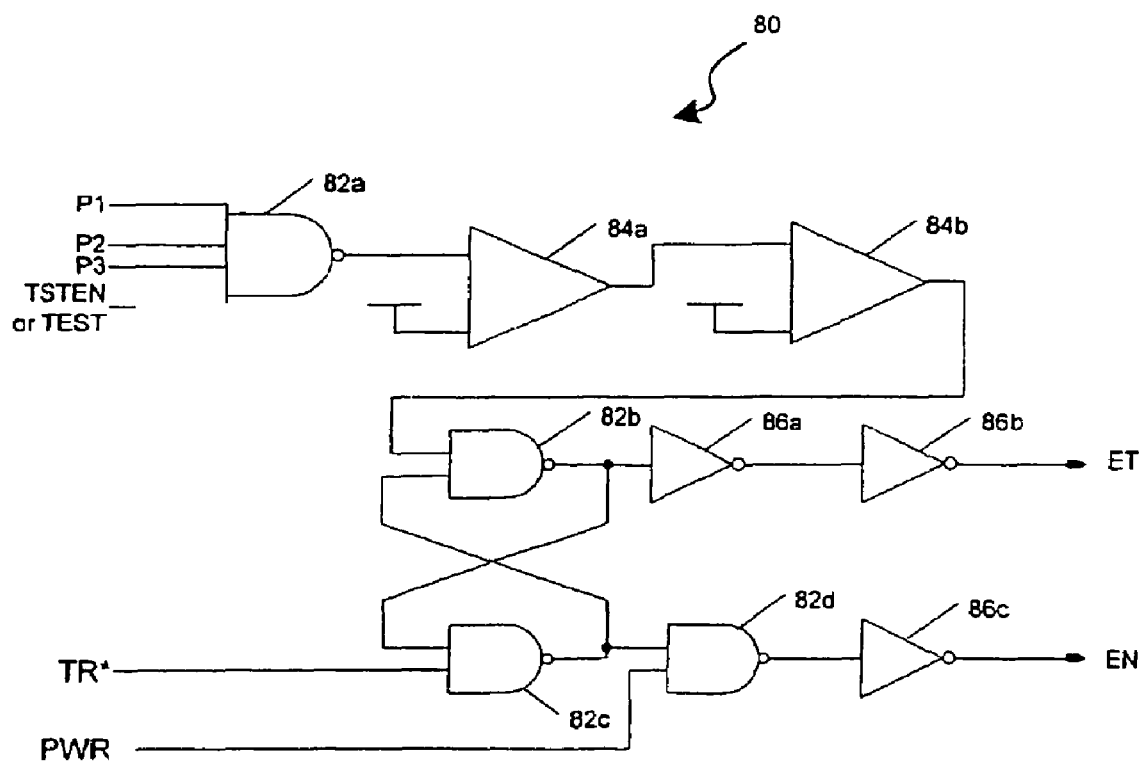
FIG. 6 is a schematic diagram of an exemplary implementation of a circuit for generating enable test and enable normal signals, according to an embodiment of the invention.

FIG. 6 is a schematic diagram of an exemplary implementation of a circuit 80 for generating the enable test (ET) and the enable normal (EN) signals, according to an embodiment of the invention. As depicted, this circuit 80 comprises NAND gates 82a, 82b, 82c, 82d, delay circuits 84a, 84b, and inverter gates 86a, 86b, and 86c.

NAND gate 82a is connected to receive the program P and TSTEN signals from the test input control buffer circuit 40. The program P signals can be associated with or correspond to the SET, LOAD, and RESET signals, for example. The delay circuits 84a and 84b delay the output generated by the NAND gate 82a. The delay circuits 84a and 84b may also filter noise or voltage spikes in order to prevent the unintentional entry into the test mode. Delay circuits 84a and 84b can be replaced with a single, larger delay circuit in alternative embodiments.

NAND gates 82b and 82c are cross-connected at one input each. The other input of NAND gate 82b is connected to receive the output of delay circuit 84b. The other input of NAND gate 82c is connected to receive a test reset (TR) signal. The test reset signal, which can be derived from a reset signal, can be used to reset an individual test mode without completely exiting the test mode. Inverter gates 86a and 86b are connected to receive the output of NAND gate 82b, while NAND gate 82d and inverter gate 86c are connected to receive the output of NAND gate 82c. The output of inverter gate 86b is the enable test (ET) signal, and the output of inverter gate 86c is the enable normal (EN) signal. The ET and EN signals are applied to the test buffer multiplexer circuit 22 (see FIGS. 2A, 2B, and 2C). In operation, depending on the combination of values for the TSTEN and program P signals, circuit 80 will output particular values for the enable test (ET) and the enable normal (EN) signals for enabling the test or normal buffers.

Control Signal Multiplexer Circuits

Figure 7:
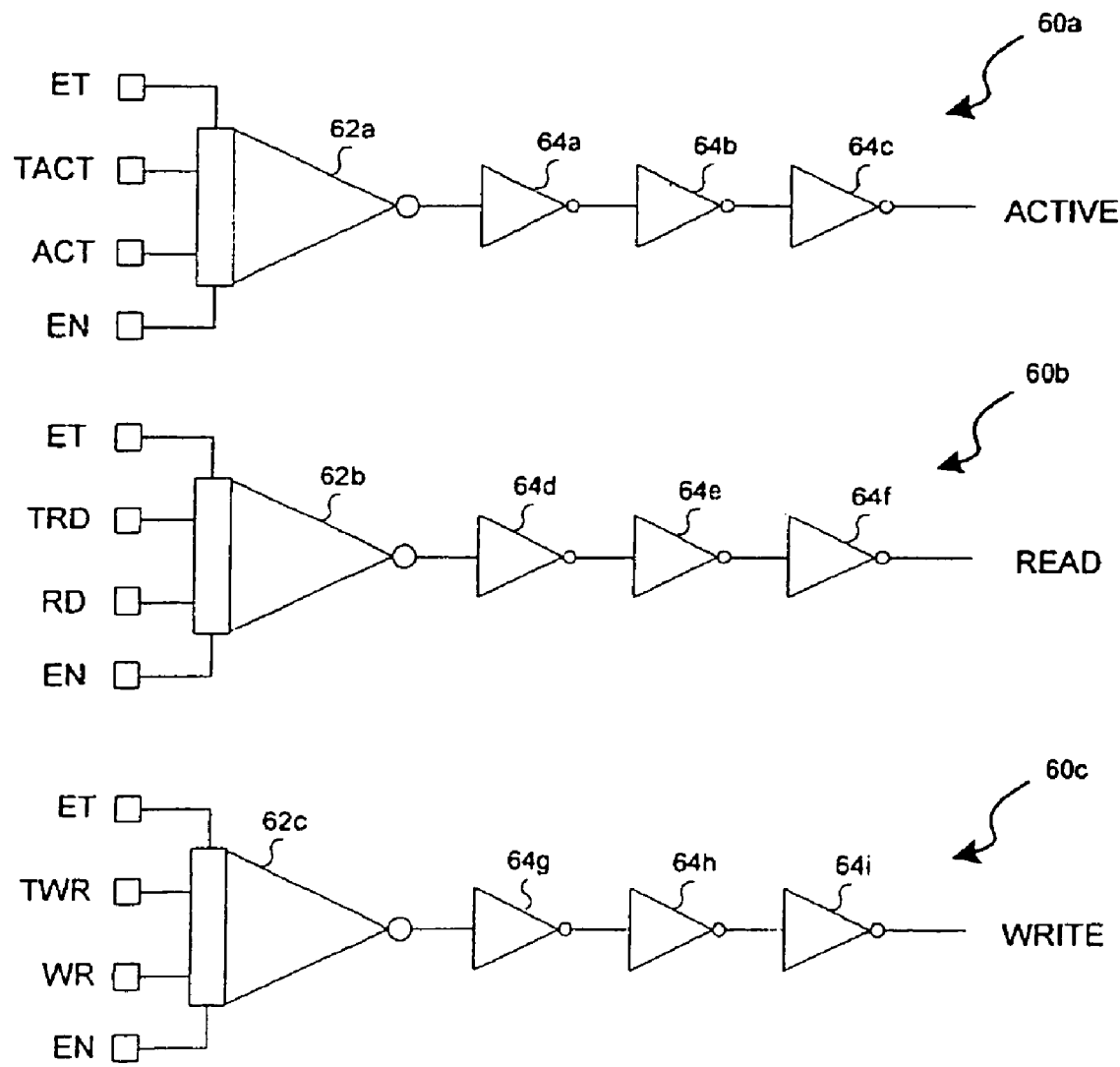
FIG. 7 is a schematic diagram of an exemplary implementation of control signal multiplexer circuits, according to an embodiment of the invention.

FIG. 7 is a schematic diagram of an exemplary implementation of control signal multiplexer circuits 60a, 60b, 60c, according to an embodiment of the invention. Control signal multiplexer circuits 60 can be implemented or incorporated in a memory 14 to support the testing thereof.

In general, each control signal multiplexer circuit 60 functions to receive, multiplex, and buffer a control signal and its counterpart test signal. These control signals include, for example, an active (ACT) signal, a read (RD) signal, and a write (WR) signal, and the counterpart test signals include a test ACT (TACT) signal, a test RD (TRD) signal, and a test WR (TWR) signal, respectively. The control signals (ACT, RD, and WR) may be received at bonding pads 16 on the memory 14 which are coupled to the system IC 12. The respective counterpart test signals (TACT, TRD, and TWR) can be received at bonding pads 16 which are connected to external terminals 20 that are shared between the memory 14 and the system IC 12. It should be understood, that in other embodiments, control signals in addition to or other than one or more of those described immediately above can also be multiplexed.

As depicted, each control signal multiplexer circuit 60 comprises a multiplex buffer 62 (separately labeled 62a, 62b, and 62c) coupled to a plurality of inverter gates 64 (separately labeled 64a-64i). In one embodiment, each multiplexer buffer 62 can be implemented with substantially similar circuitry as used for either of the implementations of test buffer multiplexer circuit 22 depicted in FIGS. 2A and 2B. Each multiplex buffer 62 receives an enable test (ET) signal, an enable normal (EN) signal, a respective control signal, and the counterpart test signal. During normal operation for the memory 14, a multiplex buffer 62 is enabled by the enable normal signal, which allows the respective control signal (e.g., ACT, RD, or WR) to be buffered and output. In the test mode, the multiplex buffer 62 is enabled by the enable test signal, which allows the respective counterpart test signal (e.g., TACT, TRD, or TWR) to be buffered and output.

The output signal from a multiplex buffer 62 is provided to the first in a respective sequence of inverter gates 64. As shown, three inventor gates 64 in series are provided in each sequence. The output of the last inverter gate 64 of each sequence is provided as a control signal to memory 14, for either normal operation or testing (depending on the ET and EN signals). It should be noted that other control signal multiplexer circuits 60 may be provided to support control signals that are in addition to, or instead of, the specific signals depicted in FIG. 7.

Set and Load Sequence

Figure 8:
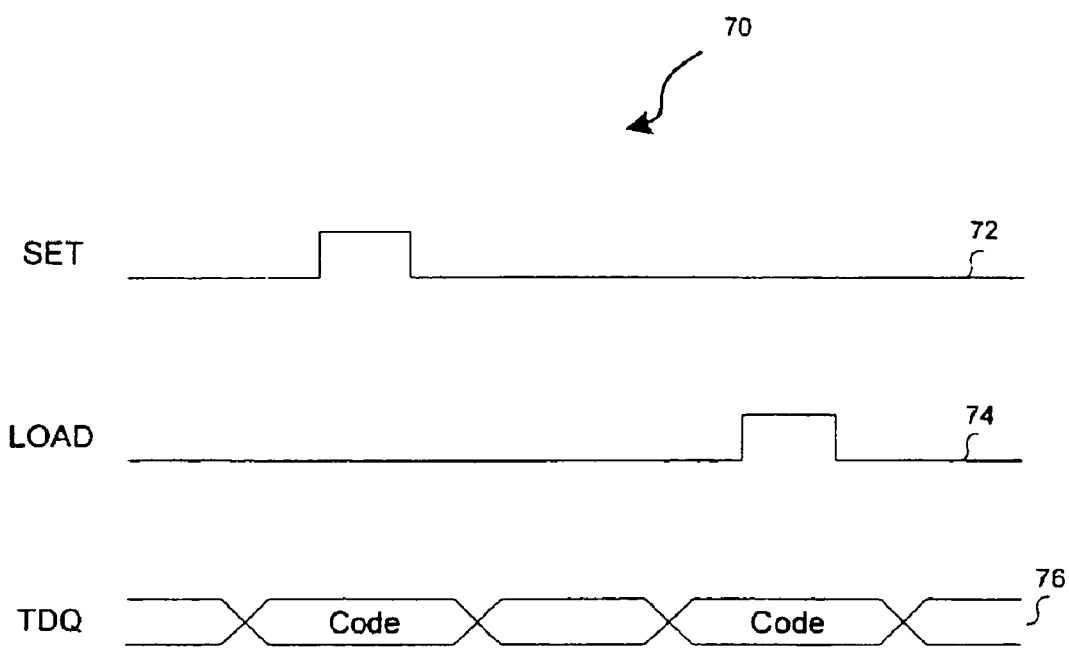
FIG. 8 is an exemplary timing diagram of a set and load sequence, according to an embodiment of the invention.

FIG. 8 is an exemplary timing diagram of a set and load sequence 70, according to an embodiment of the invention. When the memory 14 is in the test mode, sequence 70 can be used to load codes into the memory 14 during the programming phase. In particular, in one embodiment, test modes, test patterns, and test addresses are programmed in this phase.

Referring to FIG. 8, waveforms 72, 74, and 76 are given for the SET signal, the LOAD signal, and a TDQ signal, respectively. One or more TDQ signals may be used to read and write test data, set test mode codes, load row and column addresses, program least significant bits (LSB) for row and column counters, and load test data patterns. In one embodiment, eight TDQ signals are provided: TDQ[0:7]. As the exemplary waveforms in FIG. 8 illustrate, programming for testing the memory 14 can be performed asynchronously (i.e., without a clock signal). The SET and LOAD signals are used to input codes for setting test modes and enabling test addresses or vectors to be loaded. These codes can be provided in the one or more TDQ signals. The codes can indicate or represent, for example, any of the following: no test, load row address mode, reserve, load column address mode, set row counter LSB, set/load test data background equations, all even row enable, all odd row enable, disable all pumps and regulators, disable redundant rows and columns, set column counter LSB, start test counter, load data pattern, set row counter count down, set column counter count down, and individual DQ access mode.

For example, in one embodiment, to load an initial burst column address (i.e., the starting address in a column burst counter), the following command is issued using the timing shown in FIG. 8:

SET=1 with *TDQ*[7:0]=00000011→ this sets the "Load Column Address" bit active (e.g., *LCA*=1).

LOAD=1 with *TDQ*[7:0]="start address"→ load value at *TDQ*s to the column address counter.

For setting just a test mode (e.g., disabling a voltage regulator, setting access phase (i.e., TCNT=1), or setting 8× parallel test modes), then the SET signal in combination with valid TDQs is sufficient. In one embodiment, test modes can be either persistent or non-persistent. Test modes that are non-persistent go away once a new code is programmed. Test modes that are persistent will remain in effect even after a new code is programmed.

Reducing the Number of External Terminals

As noted above, during testing of the memory 14, various command signals are received from the testing equipment through a plurality of dedicated external terminals 20 (FIGS. 1 and 2). In some embodiments of the present invention, a single external terminal is used to receive multiple command signals in place of the plurality of dedicated external terminals 20. It will be appreciated that although the following embodiments are described with reference to the memory 14, the circuits and methods can be readily applied to other semiconductor devices in the semiconductor device package.

Figure 9:
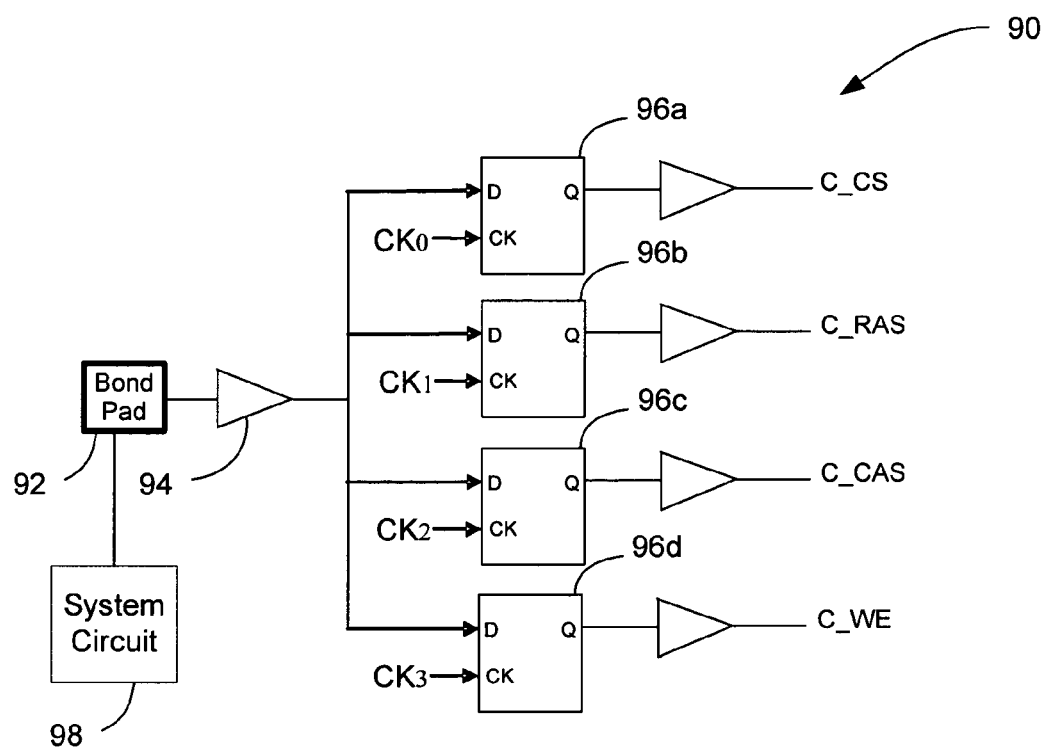
FIG. 9 is an exemplary circuit for receiving a plurality of different command signals through a single external terminal, according to an embodiment of the invention.

FIG. 9 illustrates a circuit 90, according to one embodiment of the invention, for receiving a plurality of different command signals through a single shared external terminal 92 of a semiconductor device package. Shared external terminal 92 is optionally an embodiment of external terminal 20. In the illustrated embodiment, shared external terminal 92 is coupled to input buffer 94 and the output of the input buffer 94 is coupled to an input of each of a number of parallel D flip-flops 96a, 96b, 96c, and 96d. Each of the D flip-flops 96a, 96b, 96c, and 96d is sequentially enabled by a different command input clock signal CK0, CK1, CK2, and CK3 and outputs a command signal C_CS, C_RAS, C_CAS, C_WE, respectively. The operation of circuit 90 is described in more detail below. Circuit 90 is optionally an embodiment of test input control buffer circuit 40 of FIG. 1A or FIG. 1B.

Shared external terminal 92 is also coupled to a system circuit 98, which is optionally an embodiment of System IC 12 of FIG. 1A. In some embodiments, system circuit 98 is configured to receive part of parallel data (e.g., one bit of multi-bit data) through external terminal 92 in the normal operation mode while parallel D flip-flops 96a, 96b, 96c, and 96d are configured to process serial data in the test mode. In these embodiments, external terminal 92 is configured to convey parallel data in the normal operation mode and serial data in the test mode. In the normal operation mode, additional bond pads, not shown, may be convey additional bits of the parallel data to system circuit 98.

It will be appreciated that although four D flip-flops are employed in the illustrated embodiment to provide four command signals, a different number of command signals can be accommodated with a matching number of parallel D flip-flops each enabled by a command input clock signal. It will likewise be appreciated that the same function can be achieved by substituting other digital logic devices, or combinations thereof, for the D flip-flops.

Figure 10:
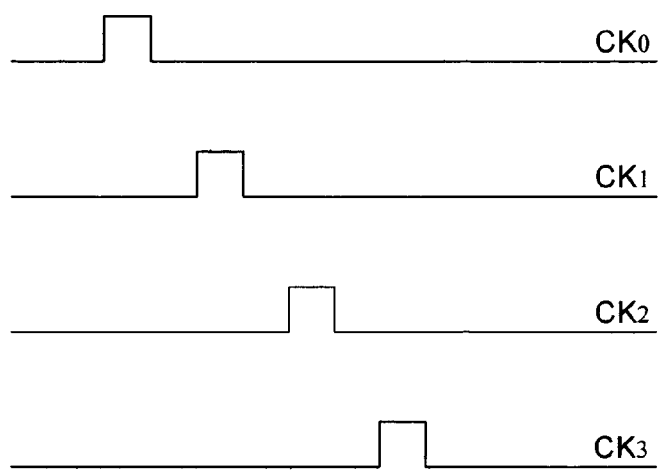
FIG. 10 is an exemplary timing diagram for a set of input clock signals used by the circuit of FIG. 9, according to an embodiment of the invention.

FIG. 10 illustrates an exemplary timing diagram for the four command input clock signals CK0, CK1, CK2, and CK3 employed by circuit 90. Referring again to FIG. 9, each of the D flip-flops 96a, 96b, 96c, and 96d will serially capture and retain (i.e. buffer) the command signal on the external terminal 92 at the time of the rising edge of the respective command input clock signal CK0, CK1, CK2, and CK3. By synchronizing the command input clock signals CK0, CK1, CK2, and CK3 with the signals being placed on the external terminal 92, it is possible to serially clock-in a sequence of command signals.

Figure 11:
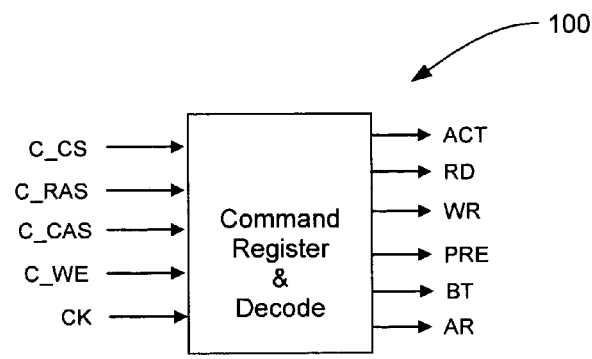
FIG. 11 is an exemplary command register & decode device, according to an embodiment of the invention.

FIG. 11 shows an exemplary command register & decode device 100. The command register & decode device 100 is configured to receive as inputs each of the outputs of the several D flip-flops of the circuit 90, as labeled in FIGS. 9 and 11. The command register & decode device 100 also has a clock signal (CK) as another input. The command register & decode device 100 outputs function signals such as active (ACT), read (RD), write (WR), and precharge (PRE). It will be understood that in some embodiments the command register is a separate device from the decode device, though illustrated as a combined device 100 in FIG. 11. In further embodiments, only the command register is required.

Referring again to FIGS. 9 and 10, once each of the command signals have been captured by the several D flip-flops, each of the command signals are presented at the inputs of the command register & decode device 100. The clock signal triggers the command register & decode device 100 to read the command signals from the inputs and to generate the appropriate function signal. The clock signal (CK) is timed to follow the last command input clock signal illustrated in FIG. 10 ($CK_3$).

The following truth table (Table 1) shows exemplary functions that can be produced by the command register & decode device 100, and exemplary combinations of command signals for each. In Table 1 a high signal is represented by (H), a low signal by (L), and either signal by (X). While the functions in Table 1 are intended to test the memory 14, it will be appreciated that in other embodiments the function signals that are generated by the command register & decode device 100 are intended to affect semiconductor devices of the semiconductor device package other than the memory 14. In some embodiments, the command register & decode device 100 receives and decodes as few as two command signals, and in other embodiments the command register & decode device 100 receives and decodes as many as eight or more command signals.

TABLE 1

Truth Table for Command Register & Decode Device

| Function Name | Signal Name | C_CS | C_RAS | C_CAS | C_WE |
|---|---|---|---|---|---|
| Command Inhibit (NOP) | NOP | H | X | X | X |
| No Operation (NOP) | NOP | L | H | H | H |
| Active | ACT | L | L | H | H |
| Read | RD | L | H | L | H |
| Write | WR | L | H | L | L |
| Burst Terminate | BT | L | H | H | L |
| Precharge | PRE | L | L | H | L |
| Auto Refresh | AR | L | L | L | H |

Figure 12:
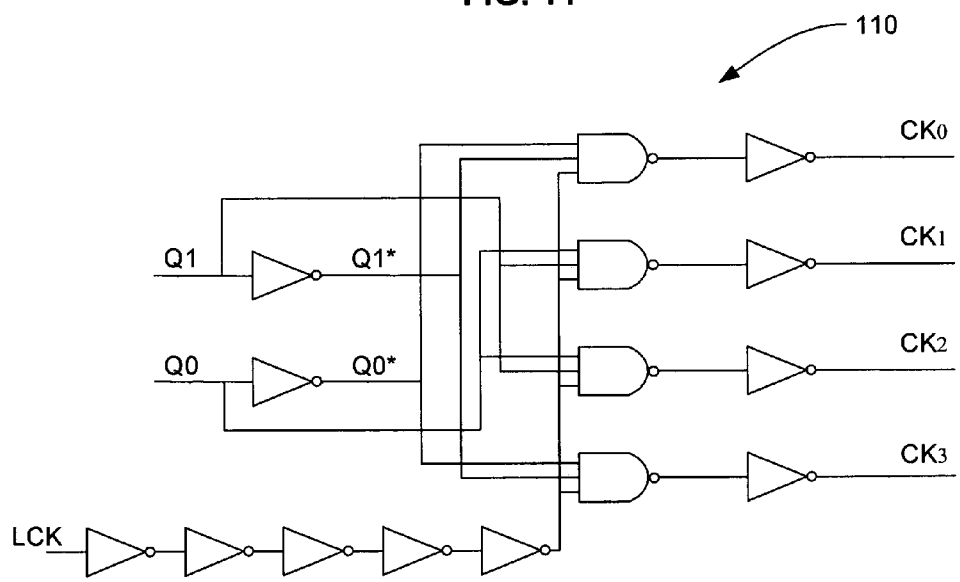
FIG. 12 is an exemplary circuit for generating the input clock signals of FIG. 11, according to an embodiment of the invention.
Figure 13:
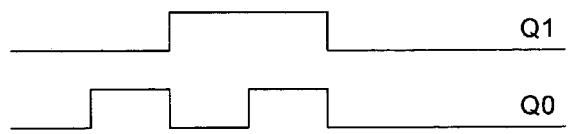
FIG. 13 shows exemplary waveforms of input signals to the circuit of FIG. 12, according to an embodiment of the invention.

FIG. 12 shows an exemplary circuit 110 for generating the sequenced command input clock signals CK0, CK1, CK2, and CK3 used in the circuit 90 of FIG. 9. Two signals, Q0 and Q1, having waveforms shown in FIG. 13, are used as inputs to circuit 110. A clock signal LCK is also used as an input. The Q0, Q1, and LCK signals are generated, for example, by a circuit 120 shown in FIG. 14. Although circuit 110 employs NAND gates, other digital logic devices can alternatively be employed.

Figure 14:
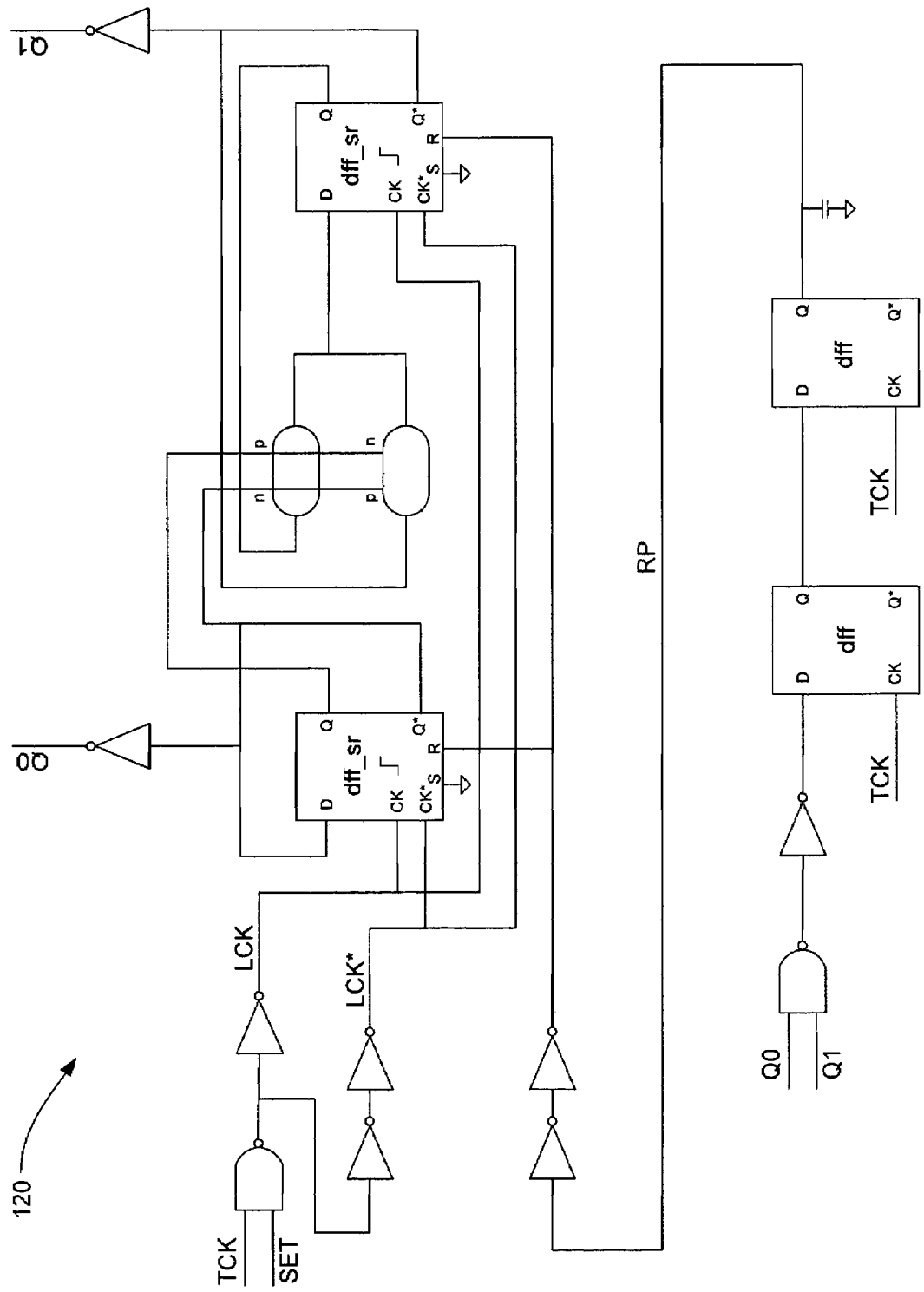
FIG. 14 is an exemplary circuit for generating the input signals to the circuit of FIG. 12, according to an embodiment of the invention.
Figure 15:
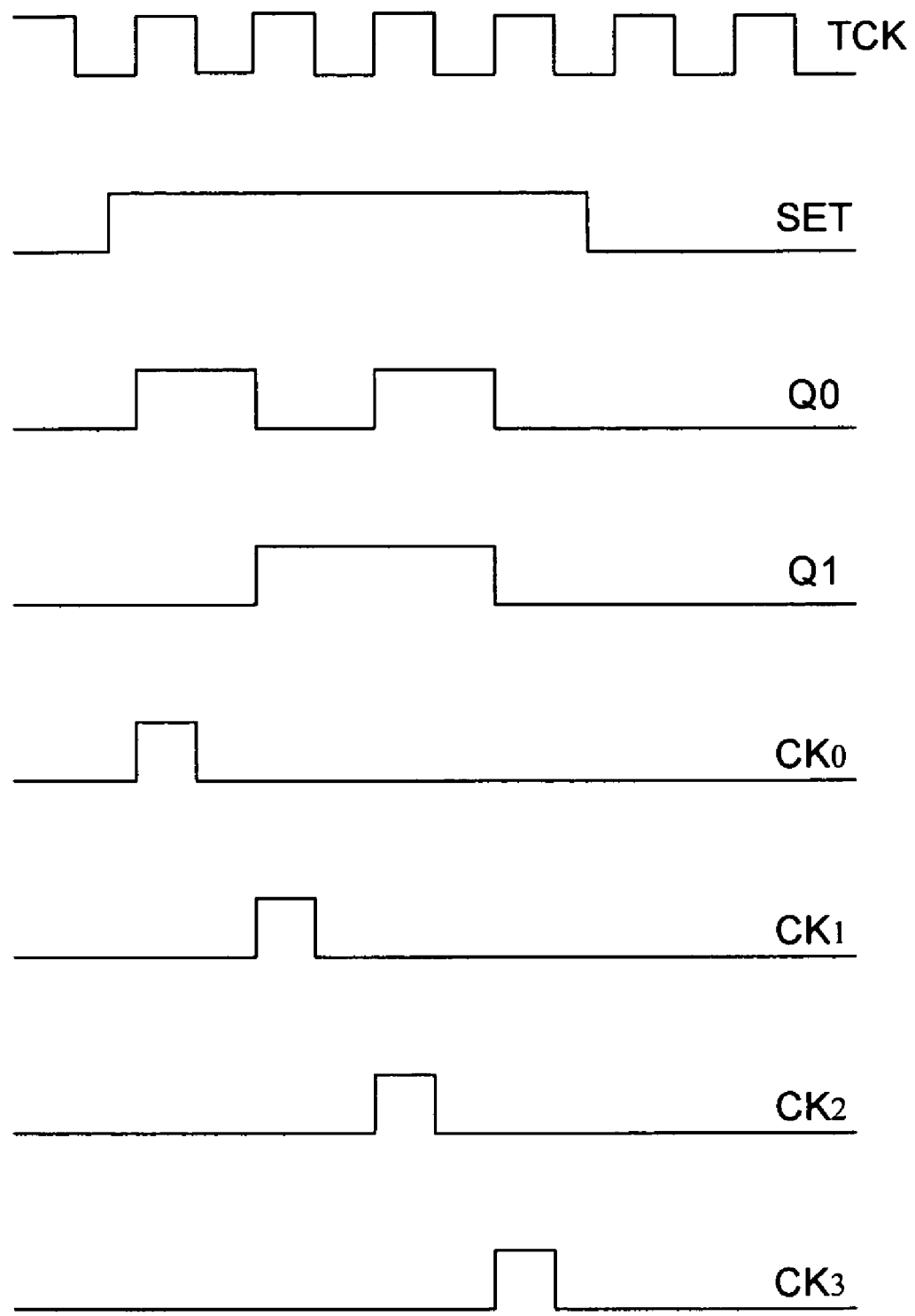
FIG. 15 shows exemplary waveforms of input signals to the circuit of FIG. 14, together with the waveforms of FIGS. 10 and 13, according to an embodiment of the invention.

FIG. 14 shows the exemplary circuit 120 for generating the Q0 and Q1 signals. The circuit 120 takes a TCK clock signal and a SET signal as inputs. Waveforms for the TCK clock signal and the SET signal are shown in FIG. 15 along with the waveforms shown in FIGS. 10 and 13. The Q0 and Q1 signals that are output by the circuit 120 are also fed back into the circuit 120 to generate a RP signal, as shown. The circuit 120 also produces the clock signal LCK that is employed by the circuit 110 (FIG. 12). As with other circuits described herein, circuit 120 is merely exemplary; many other circuits can be readily designed by one of ordinary skill in the art to produce the signals used by circuit 110. The SET input is optionally used to turn on and off functioning of the D flip-flops illustrated in FIG. 9 and/or command register & decode 100. The SET input, thus, may be used to facilitate transition between the normal operation mode and the test mode. For example, the SET input may be electronically coupled to one of external terminals 20.

It should also be noted that the method of serially clocking-in commands can also be used to reduce the number of external terminals necessary for other inputs. For example, three external terminals that are used to input the 3-bit commands necessary to decode 8 bank addresses can be combined with an external terminal used to select or load an auto-precharge command, an all bank pre-charge command, an auto refresh command, or the like. Thus, four external terminals can be reduced to one. Likewise, the eight external terminals that are used to input the 8-bit TDQ[0:7] signals can be reduced to one external terminal by serially clocking-in the TDQ[0:7] signals.

The embodiments discussed herein are illustrative of the present invention. As these embodiments of the present invention are described with reference to illustrations, various modifications or adaptations of the methods and/or specific structures described may become apparent to those skilled in the art. For example, the shared bond pad discussed herein is optionally replaced by another shared electrical connector, such as a connector pin, a socket, a plug, a receptacle, a test point, a lead, an edge connector, or the like. The semiconductor device package discussed herein optionally includes a System-in-Package, System-in-Chip, or System-in-Module.

All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated. It will be recognized that the terms "comprising," "including," and "having," as used herein, are specifically intended to be read as open-ended terms of art.

What is claimed:

1. A system comprising:
   a first integrated circuit;
   a second integrated circuit;
   a command register configured to receive a plurality of command signals for affecting the second integrated circuit;
   an external terminal configured to convey data for use by the first integrated circuit in a first mode and to convey data for use by the second integrated circuit in a second mode;
   a plurality of digital logic devices coupled between the external terminal and the command register, each digital logic device configured to receive a different clock signal and to output one of the plurality of command signals; and
   a semiconductor device package configured to package the first integrated circuit, the second integrated circuit, and the command register.

2. The system of claim 1, wherein the second integrated circuit includes a memory device.

3. The system of claim 1, wherein the second integrated circuit includes an SDRAM.

4. The system of claim 1, wherein the plurality of command signals are configured for testing the second integrated circuit.

5. The system of claim 1, wherein the external terminal includes a test point, a connector, a bond pad or a pin.

6. The system of claim 1, wherein the external terminal is configured to convey data serially to the second integrated circuit.

7. The system of claim 1, wherein the external terminal is configured for conveying data serially to the second integrated circuit and for conveying data in parallel to the first integrated circuit.

8. The system of claim 1, further comprising circuitry configured to output the different clock signals received by the digital logic devices.

9. The system of claim 1, wherein the command register is disposed within the second integrated circuit.

10. A system comprising:
a memory device configured to store digital data;
a command register configured to receive a plurality of command signals for control of the memory device;
an external terminal configured to receive serial data;
a plurality of digital logic devices coupled between the external terminal and the command register, the plurality of digital logic devices configured to receive the serial data from the external terminal and to generate the plurality of command signals responsive to the serial data; and
a semiconductor device package configured to include the memory device, the plurality of digital logic devices, and at least part of the external terminal.

11. The system of claim 10, wherein each member of the plurality of command signals is communicated from the plurality of digital logic devices to the command register as parallel data.

12. The system of claim 10, wherein the plurality of digital logic devices is included in the memory device.

13. The system of claim 10, wherein the semiconductor device package includes a system-on-chip or system-in-module.

14. The system of claim 10, wherein the plurality of digital logic devices are included in an ASIC.

15. The system of claim 10, wherein the external terminal is further configured to receive parallel data and to convey the parallel data to another device within the semiconductor package.

16. A method of testing a first integrated circuit in a semiconductor device package, the method comprising:
serially receiving a plurality of command signals at a single external terminal of the semiconductor device package;
converting the serially received plurality of command signals to parallel data;
conveying the parallel data to a command register;
affecting the first integrated circuit using the parallel data conveyed to the command register; and
using the single external terminal for conveying data to a second integrated circuit within the semiconductor device package.

17. The method of claim 16, wherein the first integrated circuit is a memory device.

18. The method of claim 16, wherein the data conveyed to the second integrated circuit is in a parallel format.

19. The method of claim 16, wherein the semiconductor device package is configured to include a system-on-chip.

20. The method of claim 16, further including changing from a test mode in which the command signals are serially received, to a normal operation mode in which the single external terminal is used for conveying data to the second integrated circuit.

21. A method of operating a memory device included in a semiconductor device package, the method comprising:
receiving a serial data signal at an external terminal of the semiconductor device package;
conveying the received serial data signal to a plurality of digital logic devices configured to generate a command signal responsive to the received serial data;
receiving the generated command signal in a parallel format at a command register; and
operating the memory device responsive the command signal received at the command register.

22. The method of claim 21, wherein the external terminal is shared with a system integrated circuit, and configured to convey data for use by the memory device in a test mode and configured to convey data for use by the system integrated circuit in a normal operation mode.

23. The method of claim 21, further comprising generating a plurality of sequenced clock signals for use by the plurality of digital logic devices.

24. The method of claim 21, wherein the command signal received at the command register includes a bank address.

25. A system comprising:
shared means for serially receiving a command signal at a semiconductor device package, and for receiving first parallel data at the semiconductor device package;
means for converting the serially received command signal to second parallel data;
means for conveying the second parallel data to a command register;
means for testing a first integrated circuit within the semiconductor device package using the second parallel data conveyed to the command register, in a first mode;
means for changing from the first mode to a second mode; and
means for operating a second integrated circuit within the semiconductor device package responsive to the first parallel data in the second mode.

26. The system of claim 25, wherein the second integrated circuit is a memory device.

27. The system of claim 25, wherein the second parallel data includes a write enable (WE) command.

28. The system of claim 25, wherein the first mode is a test mode, and the second mode is a normal operation mode.

29. The system of claim 25, wherein the second parallel data includes a bank select (BA) command.

* * * * *